United States Patent
Asano

(10) Patent No.: US 7,186,297 B2
(45) Date of Patent: Mar. 6, 2007

(54) WAFER HOLDING APPARATUS

(75) Inventor: Hiroshi Asano, Fukuoka (JP)

(73) Assignee: Kabushiki Kaisha Yaskawa Denki, Fukuoka (JP)

(*) Notice: Subject to any disclaimer, the term of this patent is extended or adjusted under 35 U.S.C. 154(b) by 202 days.

(21) Appl. No.: 10/450,654

(22) PCT Filed: Dec. 13, 2001

(86) PCT No.: PCT/JP01/10950

§ 371 (c)(1),
(2), (4) Date: Jun. 16, 2003

(87) PCT Pub. No.: WO02/49097

PCT Pub. Date: Jun. 20, 2002

(65) Prior Publication Data

US 2004/0048474 A1    Mar. 11, 2004

(30) Foreign Application Priority Data

Dec. 15, 2000 (JP) .............................. 2000-382718

(51) Int. Cl.
*H01L 21/302* (2006.01)
(52) U.S. Cl. ..................................... 118/728; 118/668
(58) Field of Classification Search ................ 118/500, 118/728, 676, 668, 675; 414/5, 941
See application file for complete search history.

(56) References Cited

U.S. PATENT DOCUMENTS

| | | | | |
|---|---|---|---|---|
| 4,676,884 A | * | 6/1987 | Dimock et al. ........ | 204/192.12 |
| 5,133,635 A | * | 7/1992 | Malin et al. ............. | 414/744.8 |
| 5,810,935 A | * | 9/1998 | Lee et al. .................. | 118/728 |
| 6,167,322 A | * | 12/2000 | Holbrooks ................. | 700/112 |
| 6,256,555 B1 | * | 7/2001 | Bacchi et al. ............. | 700/245 |
| 6,614,201 B2 | * | 9/2003 | Saino et al. ........... | 318/568.11 |
| 6,817,640 B2 | * | 11/2004 | Menon et al. ........... | 294/103.1 |
| 6,909,276 B2 | * | 6/2005 | Hofer et al. ............. | 324/158.1 |

FOREIGN PATENT DOCUMENTS

| | | |
|---|---|---|
| JP | 3-154794 A | 7/1991 |
| JP | 7-37960 A | 2/1995 |
| JP | 7-193114 A | 7/1995 |
| JP | 11-220002 A | 8/1999 |
| JP | 2000-68352 A | 3/2000 |
| JP | 2000-77497 A | 3/2000 |
| JP | 2000-306982 A | 11/2000 |

* cited by examiner

*Primary Examiner*—Ram Kackar
*Assistant Examiner*—Sylvia R. MacArthur
(74) *Attorney, Agent, or Firm*—Sughrue Mion, PLLC

(57) ABSTRACT

The invention provides a wafer holding apparatus which enables ascertainment of gripping and presence/absence of a wafer through use of single detection means.

The apparatus has drive means (2) having a pressing element (8) which advances or recedes in a longitudinal direction; and detection means (9) for detecting advancement/receding of the pressing element (8). When the detection means (9) has detected that the pressing element (8) has advanced to and come to a halt at a predetermined position, the wafer is determined to be properly held. When the detection means (9) has detected that the pressing element (8) has advanced in excess of the predetermined position, the wafer is determined not to be present on the wafer holding apparatus.

8 Claims, 3 Drawing Sheets

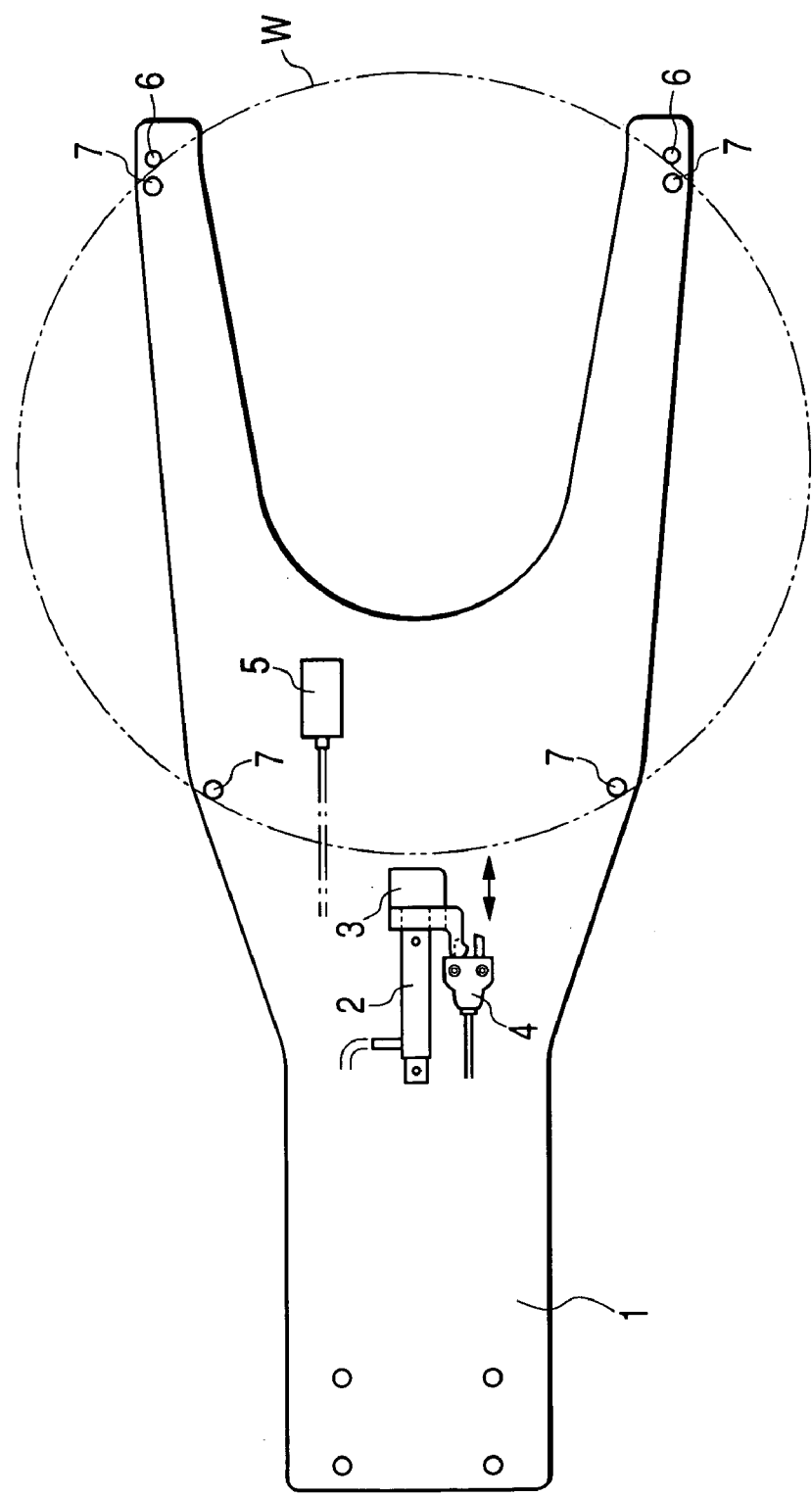

WAFER HOLDING APPARATUS

FIELD OF THE INVENTION

The invention relates to a wafer holding apparatus to be attached to the extremity of a robot arm which transfers a wafer within a semiconductor manufacturing apparatus or between pieces of semiconductor manufacturing apparatus, and more particularly, to a wafer holding apparatus which supports a wafer by gripping an outer edge of a wafer.

BACKGROUND ART

An apparatus which supports a wafer by gripping an outer edge of the wafer has hitherto been known as an apparatus which is to be attached to an extremity of an arm of a wafer transport robot and grips a wafer.

FIG. 3 shows a related-art example of such a wafer holding apparatus. In the drawing, reference numeral 1 designates a base material of the wafer holding apparatus. The base material 1 is a thin plate with a bifurcated extremity. Reference 2 designates an air cylinder which is secured on a root of the base material 1 and serves as drive means for actuating a pressing piece 3 attached to the extremity of the air cylinder in a longitudinal direction. The pressing element 3 is a member for pressing the outer edge of the wafer W, and the surface of the pressing element 3 to be brought into contact with the wafer W is flat. Reference numeral 4 designates an operation confirmation sensor which serves as detection means for checking operation of the air cylinder 2. Reference numeral 5 designates a wafer presence/absence sensor which checks presence or absence of a wafer W on the wafer holding apparatus. Reference numeral 6 designates stopper pins which are cylindrical stationary elements fixed at the respective extremities of the bifurcated portions of the base material 1. The stopper pins are for receiving a wafer W pressed by the pressing element 3. In other words, the wafer W is fixedly sandwiched between the pressing element 3 and the stopper pins 6. Reference numeral 7 designates support pins. Four support pins are fixed within a plane located between the pressing element 3 of the base material 1 and the stopper pins 6. The support pins 7 are cylindrical and have flat top faces and serve as support elements which support the weight of the wafer W while the wafer W is placed on the top faces.

Such a related-art wafer holding apparatus requires two types of sensors; that is, the operation confirmation sensor 4 and the wafer presence/absence sensor 5. Therefore, the accompanying complicated configuration of the wafer holding apparatus leads to a problem, such as a cost hike, an increase in weight, or deterioration in reliability.

A contact surface of the pressing element 3 is flat. Hence, there arises another problem in that, when the pressing element presses the wafer W, the wafer W sometimes leaps up while the stopper pins 6 serve as fulcrums, thereby causing difficulty in realization of stable holding.

The top faces of the support pins 7 are flat, leading to still another problem of a large contact area existing between the support pins 7 and the wafer W, thereby leading to adhesion of large amounts of particles.

DISCLOSURE OF THE INVENTION

The invention is aimed at providing a wafer holding apparatus which enables ascertainment of holding of a wafer and presence/absence of the same through use of single detection means.

The invention is also aimed at providing a wafer holding apparatus which enables stable holding action by preventing occurrence of leaping of a wafer.

The invention is also aimed at providing a wafer holding apparatus which involves a smaller contact area between a wafer and supporting elements and adhesion of smaller amounts of particles.

In order to solve the problems, an invention of claim 1 provides a wafer holding apparatus having a flat base material; drive means having a pressing element, the element being attached to a root section of the base material and being actuated back and forth in a longitudinal direction of the base material; detection means for detecting advancing/receding action of the pressing element; fixing elements fixed at extremities of the base material; and supporting elements provided on the base material and between the pressing element and the fixing elements, an outer edge of a wafer being gripped and fixed with the pressing element and the fixing elements while the wafer is placed on the supporting elements, wherein, when the detection means has detected that the pressing element has advanced to and stopped at a predetermined position, the wafer is determined to be properly gripped; and wherein, when the detection means has detected that the pressing element has advanced in excess of the predetermined position, the wafer is determined not to be present on the wafer holding apparatus.

An invention of claim 2 is that a hood-like bulge section for preventing leaping of the wafer is provided on the surface of the pressing element which comes into contact with the wafer.

An invention of claim 3 is that the supporting elements are formed so as to assume such a shape that a cross-sectional area becomes smaller from a base section to an extremity, and that point or line contact exists between the supporting element and the wafer.

BRIEF DESCRIPTION OF THE DRAWINGS

FIG. 2(*a*) shows a state of the wafer holding apparatus before gripping a wafer W. FIG. 2(*b*) shows that the wafer W is gripped. FIG. 2(*c*) shows that no wafer W is present.

FIG. 3 is a plan view of a wafer holding apparatus, showing a related-art example.

BEST MODE FOR IMPLEMENTING THE INVENTION

Figure 1:
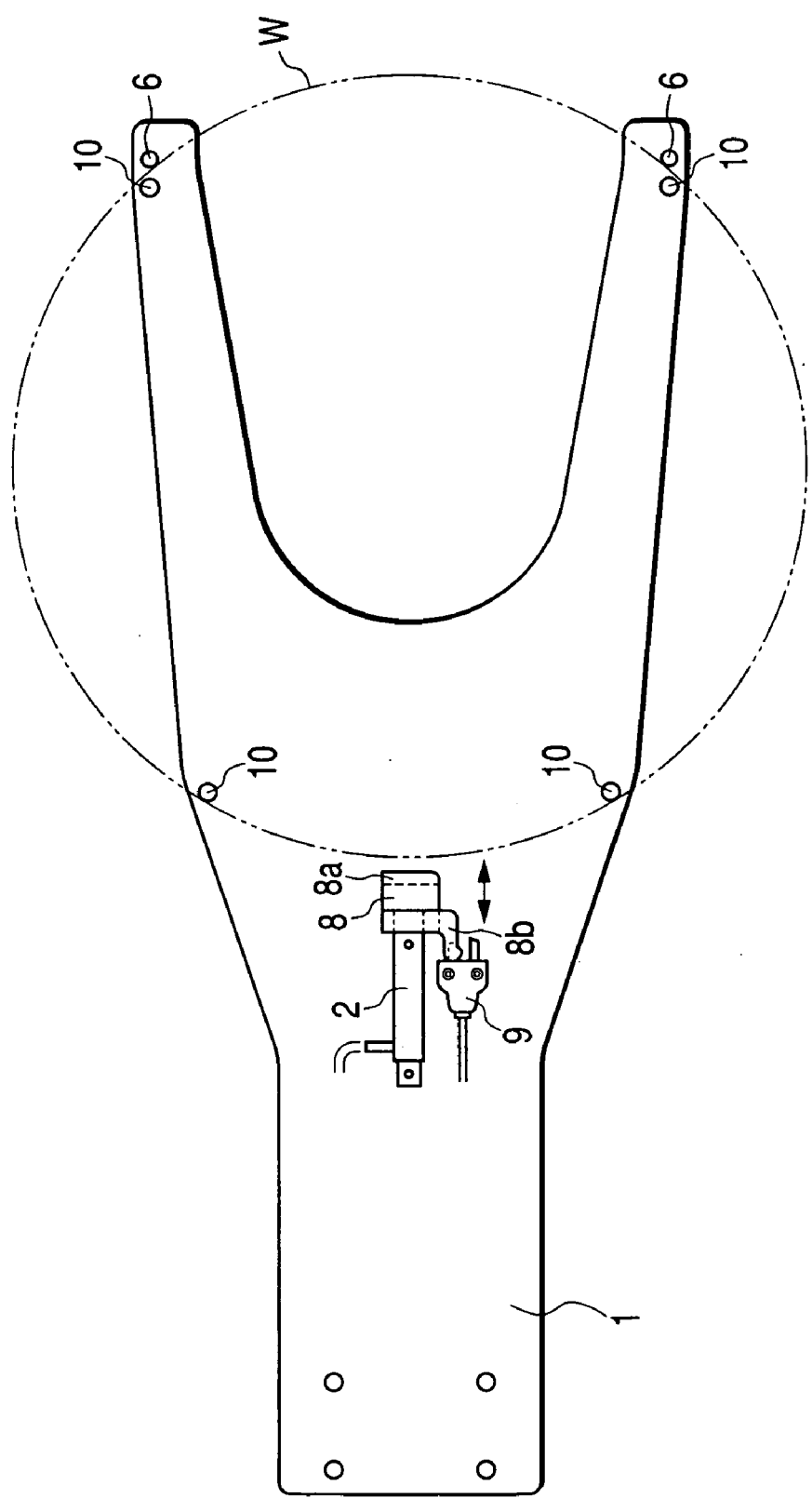
FIG. 1 is a plan view of a wafer holding apparatus, showing an embodiment of the invention.

An embodiment of the invention will be described hereinbelow by reference to the drawings. Elements which are common to those of the related-art wafer holding apparatus are assigned the same reference numerals, and their repeated explanations are omitted.

FIG. 1 is a plan view of a wafer holding apparatus, showing an embodiment of the invention. In the drawing, reference numeral 8 designates a pressing element which is attached to an air cylinder 2 and advances or recedes in a longitudinal direction. Reference numeral 9 designates an operation confirmation sensor to be used as detection means, the means detecting the position of the pressing element 8 and ascertaining gripping and presence/absence of a wafer W. Reference numeral 10 designates support pins provided for supporting the wafer W.

Figure 2A:
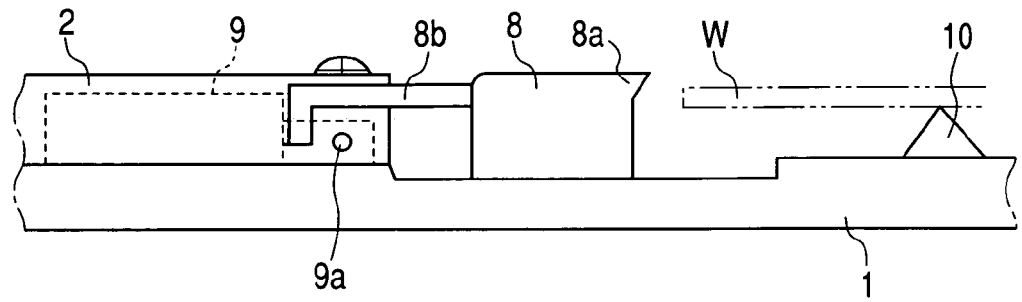
FIGS. 2(*a*) to 2(*c*) show the descriptive views showing functions of the wafer holding apparatus, showing the embodiment of the invention.
Figure 2B:
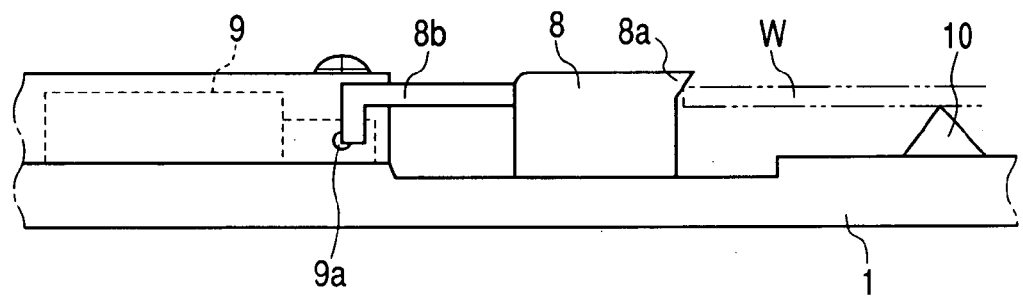
Figure 2C:
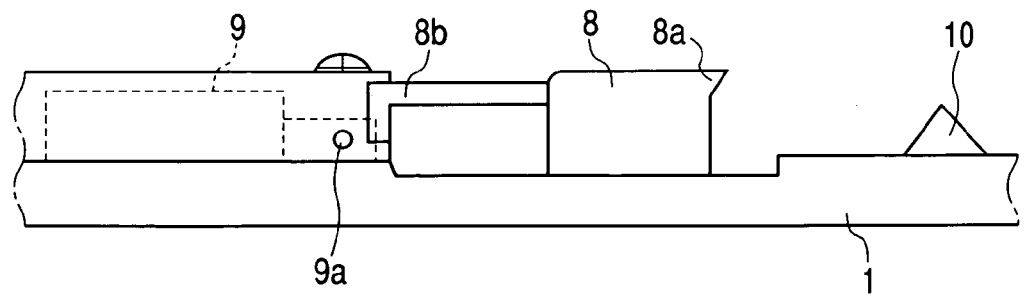

FIGS. 2(a) to 2(c) show the descriptive view showing functions of the wafer holding apparatus, showing the embodiment of the invention. FIG. 2(a) shows a state of the wafer holding apparatus before gripping a wafer W. FIG. 2(b) shows that the wafer W is gripped. FIG. 2(c) shows that no wafer W is present. In the drawings, reference numeral 8a designates a hood-like bulge section provided on a surface of the pressing element 8 which comes into contact with the wafer. Reference numeral 8b designates a dog to be used for indicating the position of the pressing element to an operation confirmation sensor 9. Reference numeral 9a designates a window to be used for detection operation of the operation confirmation sensor 9. A light ray emitted from the window 9a is detected by a light-receiving section (not shown) disposed opposite the window 9a. The operation confirmation sensor 9 detects the position of the pressing element 8 by detecting whether or not the dog 8b interrupts the light ray.

As shown in FIG. 2(a), in a state in which the pressing element 8 remains in a receded position (a left side in the drawing), the dog 8b is situated on the left of the window 9a. Hence, the operation confirmation sensor 9 does not detect the dog 8b. In this state, the wafer holding apparatus can be determined to be in a state before holding the wafer W.

As shown in FIG. 2(b), when the wafer holding apparatus holds the wafer W, the pressing element 8 advances forward (in a rightward direction in the drawing) and comes to a halt upon contact with the wafer W. At this time, the dog 8b comes to a halt in front of the window 9a, and the operation confirmation sensor 9 detects the dog 8b. In this state, the wafer holding apparatus can be determined to properly hold the wafer W.

If for any reason the wafer W is not present on the wafer holding apparatus, as shown in FIG. 2(c) the pressing element 8 advances further forward (i.e., in the rightward direction in the drawing) from the position shown in FIG. 2B, thus traveling to the maximum stroke of the air cylinder 2. At this time, the dog 8b travels to the right side of the window 9a after having once crossed the front surface of the window 9a. Hence, the operation confirmation sensor 9 has once detected the dog 8b and no longer detects the same. In this state, the wafer can be determined not to be present on the wafer holding apparatus.

The surface of the pressing element 8 that comes into contact with the wafer W has the hood-like bulge 8a. Hence, as shown in FIG. 2(b), when the pressing element presses the wafer W, the bulge section 8a presses the outer edge of the wafer W from above, thereby preventing leaping of the wafer W and maintaining a stable gripped state of the wafer.

As shown in FIGS. 2(a) to 2(c), the supporting elements 10 each have a knife-shaped side surface whose upper end is pointed (i.e., the area where the wafer W is placed). The wafer W comes into contact with the support pin 10 on the line of the knife-shaped edge. Consequently, a contact area existing between the wafer W and the supporting elements 10 becomes very small, whereby the amount of particles adhering to the wafer W becomes extremely small. Here, the supporting pin 10 may assume a conical shape instead of the shape of a knife and may support the wafer W by way of a point.

As mentioned above, the invention yields the following advantages.

According to the invention of claim 1, single detection means ascertains holding and presence/absence of a wafer. Hence, the invention has the effect of curtailing costs and weight of the wafer holding apparatus and enhancing the reliability of the same. According to the invention of claim 2, the bulge section provided on the pressing element prevents leaping of a wafer, thereby yielding an advantage of the ability to effect stable holding of the wafer.

According to the invention of claim 3, a very small contact area exists between the wafer and the supporting elements. Hence, there is yielded an advantage of the ability to make the amount of particles adhering to the wafer considerably small.

INDUSTRIAL APPLICABILITY

The invention is useful as a wafer holding apparatus to be attached to an extremity of an arm of a robot which transports a wafer within a semiconductor manufacturing apparatus or between pieces of semiconductor manufacturing apparatus.

The invention claimed is:

1. A wafer holding apparatus having a flat base material; drive means with a pressing element, the element being attached to a root section of the base material that has a substantially U-shaped portion and being actuated back and forth in a longitudinal direction of the base material, the longitudinal direction being an opening direction of the U-shaped portion of the base material; optical detection means for detecting advancing/receding action of the pressing element; fixing elements fixed at extremities of the base material; and supporting elements provided on the base material and between the pressing element and the fixing elements, an outer edge of a wafer being gripped and fixed with the pressing element and the fixing elements while the wafer is placed on the supporting elements, wherein, when the optical detection means has detected that the pressing element has advanced to and stopped at a predetermined position, the wafer is determined to be properly gripped; and wherein, when the optical detection means has detected that the pressing element has advanced in excess of the predetermined position, the wafer is determined not to be present on the wafer holding apparatus.

2. A wafer holding apparatus having a flat base material; drive means with a pressing element, the element being attached to a root section of the base material that has a substantially U-shaped portion and being actuated back and forth in a longitudinal direction of the base material the longitudinal direction being an opening direction of the U-shaped portion of the base material that has a substantially U-shaped portion; detection means for detecting advancing/receding action of the pressing element; fixing elements fixed at extremities of the base material; and supporting elements provided on the base material and between the pressing element and the fixing elements, an outer edge of a wafer being gripped and fixed with the pressing element and the fixing elements while the wafer is placed on the supporting elements, wherein, when the detection means has detected that the pressing element has advanced to and stopped at a predetermined position, the wafer is determined to be properly gripped; and wherein, when the detection means has detected that the pressing element has advanced in excess of the predetermined position, the wafer is determined not to be present on the wafer holding apparatus, wherein a hood-like bulge section for preventing leaping of the wafer is provided on the surface of the pressing element which comes into contact with the wafer.

3. The wafer holding apparatus according to claim 1 or 2, wherein the supporting elements are formed so as to assume such a shape that a cross-sectional area becomes smaller from a base section to an extremity and that point or line contact exists between the supporting element and the wafer.

4. A wafer holding apparatus comprising:

a flat base material;

a driver with a pressing element attached to a root section of the base material that has a substantially U-shaped portion, the pressing element operable to move back and forth in a longitudinal direction of the base material, the longitudinal direction being an opening direction of the U-shaped portion of the base material;

an optical detector operable to detect advancing/receding action of the pressing element;

at least one fixing element fixed at extremities of the base material; and at least one supporting element provided on the base material and between the pressing element and the fixing element, the pressing element, the fixing element and the supporting element being operable to fix a wafer;

the optical detector being operable to determine that the wafer is properly gripped when the pressing element has advanced to and stopped at a predetermined position, and the optical detector being operable to determine that no wafer is present when the pressing element has advanced in excess of the predetermined position.

5. A wafer holding apparatus comprising:

a flat base material;

a driver with a pressing element attached to a root section of the base material, that has a substantially U-shaped portion, the pressing element operable to move back and forth in a longitudinal direction of the base material, the longitudinal direction being an opening direction of the U-shaped portion of the base material;

a detector operable to detect advancing/receding action of the pressing element;

at least one fixing element fixed at extremities of the base material; and at least one supporting element provided on the base material and between the pressing element and the fixing element, the pressing element, the fixing element and the supporting element being operable to fix a wafer;

the detector being operable to determine that the wafer is properly gripped when the pressing element has advanced to and stopped at a predetermined position, and the detector being operable to determine that no wafer is present when the pressing element has advanced in excess of the predetermined position, wherein the pressing element includes a hood-like bulge section operable to contact the wafer and prevent leaping of the wafer.

6. The wafer holding apparatus according to claim 4, wherein the supporting element has a decreasing cross-section area from the base to the extremity, the extremity operable to maintain a point or line contact with the wafer.

7. The wafer holding apparatus of claim 4, wherein the pressing element has a dog portion operable to block an optical window only when the wafer is firmly gripped.

8. The wafer holding apparatus of claim 7, wherein the dog portion is operable to proceed beyond and not block the optical window when no wafer is present.

* * * * *